United States Patent
Park

(10) Patent No.: US 6,486,738 B2
(45) Date of Patent: Nov. 26, 2002

(54) DEVICE FOR CONTROLLING POWER IN POWER AMPLIFIER OF A PORTABLE WIRELESS TERMINAL

(75) Inventor: Jae-Sun Park, Kyonggi-do (KR)

(73) Assignee: Samsung Electronics, Co., Ltd. (KR)

( * ) Notice: Subject to any disclaimer, the term of this patent is extended or adjusted under 35 U.S.C. 154(b) by 23 days.

(21) Appl. No.: 09/737,124

(22) Filed: Dec. 14, 2000

(65) Prior Publication Data

US 2001/0006355 A1 Jul. 5, 2001

(30) Foreign Application Priority Data

Dec. 31, 1999 (KR) .............................. 99-68286

(51) Int. Cl.⁷ .............................................. H03G 3/10
(52) U.S. Cl. ...................... 330/285; 330/129; 330/279; 330/297
(58) Field of Search ................ 330/129, 279, 330/285, 297

(56) References Cited

U.S. PATENT DOCUMENTS

| | | | | |
|---|---|---|---|---|
| 4,709,403 A | * | 11/1987 | Kikuchi | 330/279 |
| 5,043,672 A | * | 8/1991 | Youn | 330/279 |
| 5,896,064 A | * | 4/1999 | Kaku | 330/279 |
| 6,252,455 B1 | * | 6/2001 | Kurby et al. | 330/136 |
| 2001/0006355 A1 | * | 7/2001 | Park | 330/285 |

* cited by examiner

*Primary Examiner*—Michael B Shingleton
(74) *Attorney, Agent, or Firm*—Dilworth & Barrese, LLP

(57) ABSTRACT

A device for controlling voltage in a power amplifier of a portable wireless terminal according to the present invention, includes a power amplifier adapted to adjust an amplification degree of a signal inputted in response to a supply state of a reference voltage to output the adjusted signal. The device also includes a comparator/limiter adapted to compare a value of a transmitting automatic gain controlled (TX_AGC) supply voltage and a value of an operating supply voltage to output the compared result and a power supply conversion section adapted to convert a state of the compared result outputted from the comparator/limiter into a reference voltage state for application to the power amplifier as a reference voltage thereof.

7 Claims, 4 Drawing Sheets

DEVICE FOR CONTROLLING POWER IN POWER AMPLIFIER OF A PORTABLE WIRELESS TERMINAL

PRIORITY

This application claims priority to an application entitled "Device For Controlling Power in Power Amplifier of Portable Wireless Terminals" filed in the Korean Industrial Property Office on Dec. 31, 1999 and assigned Serial No. 68286/1999, the contents of which are hereby incorporated by reference.

BACKGROUND OF THE INVENTION

1. Field of the Invention

The present invention relates to a device for controlling voltage in power amplifier of portable wireless terminals, and more particularly to a device for controlling voltage in power amplifiers of portable wireless terminals which prevents unnecessary power consumption by effectively controlling voltage to a power amplifier included in portable communication equipment.

2. Description of the Related Art

In general, portable wireless terminals include a power amplifier for adjusting a transmission power level of a reverse link radio signal according to a receiving strength. However, such a power amplifier consumes a significant portion of the power consumed in the portable wireless terminal. Newer portable wireless terminals require the consumption of less power. One method of reducing power consumption is by controlling voltage of the power amplifiers to improve power efficiency. A device is therefore needed to control the power amplifiers with improved power efficiency allowing the power amplifiers to generate necessary power needed to transmit the maximum radio signal level. Moreover, terminals used in current CDMA type wireless terminal systems require good linearity. But, since such terminals place an emphasis on linearity, many problems arise which reduce power efficiency. Accordingly, to resolve this problem, typical CDMA type portable wireless terminals adjust bias current for controlling voltage of the power amplifiers within a range satisfying an adjacent channel interference ratio according to a sending power level so that power efficiency can be improved.

FIG. 1 is a block diagram illustrating a device for controlling voltage in a power amplifier 100 of a portable wireless terminal as stated above according to the prior art.

Referring to FIG. 1, the power amplifier 100 generally includes a two-stage amplifier. In the case where a modulation scheme requiring linearity in a system is adopted, for example, for a PSK modulation scheme, a first stage includes a Class A type amplifier 101, and a second stage includes a Class AB type amplifier 103. However, the power amplifier 100 may also include a third stage. In such a case, the power amplifier 100 includes an additional Class AB type amplifier.

In the meantime, a supply voltage of the above power amplifier is typically classified into a reference voltage Vref and a driving voltage Vcc. The reference voltage Vref is generally used as a bias supply voltage for the initial stage amplifier 101 of Class A type, and the driving voltage Vcc is used as a bias supply voltage for the end stage amplifier 103 of Class AB type. In some cases, the reference voltage Vref may be used as a base bias, and the driving voltage Vcc may be used as a collector bias.

As stated above, the initial stage of the power amplifier uses the Class A type amplifier 101 for ensuring linearity and the end stage thereof uses the Class AB type amplifier 103 for reducing power consumption. When an input signal is very small, in the Class A type initial stage amplifier 101, a problem arises since a fixed current supplied to the power amplifier is still consumed. Here, although there is a minute difference in the consumed current between real products to which the corresponding power amplifier is applied, the amount of the consumed current is typically about 100 mA. For this reason, conventionally, Vbb1 and Vbb2 are connected to the reference voltage Vref through a switch 109 to selectively reduce the consumed current.

FIG. 2 is a graph illustrating a power supplying state according to the operation of a device for selectively controlling voltage in a typical power amplifier 100 as stated above according to the prior art.

Now, the power supplying operation of the power amplifier 100 will be described in detail hereinafter with reference to FIG. 2.

Referring to the graphical representation of FIG. 2, an abscissa axis is scaled in terms of an output, and an ordinate axis is scaled in terms of a reference voltage Vref. As can be seen from the graphical representation, when the output level is increased beyond Pout2, Vbb2 is supplied as a reference voltage Vref of the power amplifier 100. On the other hand, when the output is decreased to less than Pout1, Vbb1 is supplied as the reference voltage Vref of the power amplifier 100. That is, a method of supplying power according to the prior art may be seen from the above graph. The reason for setting output levels according to whether voltage is increasing or voltage is decreasing is to prevent the power amplifier from being in an unstable state when voltage is increasing or decreasing at the same output. Such a method of supplying power according to the prior art is applied in consideration of the stability of the power amplifier.

Consequently, there is preferably a difference in power levels by above 5 dB between the Pout1 and the Pout2 for stable operation of the power amplifier.

However, in view of the above description, it can be appreciated that the level of the reference voltage is set high unnecessarily at an output between Pout1 and Pout2 at which the level of the reference voltage may be low. To date, a method of preventing a loss of power has not been implemented in the prior art.

There is therefore a need in the art for a device for and a method of controlling voltage in a power amplifier of a portable wireless terminal which prevents unnecessary power consumption by the power amplifier by effectively controlling voltage to the power amplifier.

SUMMARY OF THE INVENTION

Therefore, an object of the present invention is to provide a device for controlling voltage in a power amplifier of a portable wireless terminal which prevents unnecessary power consumption of the power amplifier by effectively controlling voltage to the power amplifier.

It is another object of the present invention to provide a device for controlling voltage in a power amplifier of a portable wireless terminal which minimizes unnecessary power consumption by the power amplifier by effectively controlling voltage to the power amplifier so that the operating time of both a portable wireless terminal using a battery and telecommunication equipment equivalent to the portable wireless terminal can be extended.

To achieve the above objects, a device for controlling voltage in a power amplifier of a portable wireless terminal according to the present invention, includes a power amplifier adapted to adjust an amplification degree of a signal inputted in response to a supply state of a reference voltage to output the adjusted signal. The device also includes a comparator/limiter adapted to compare a value of a transmitting automatic gain controlled (TX_AGC) supply voltage and a value of an operating supply voltage to output the compared result and a power supply conversion section adapted to convert a state of the compared result outputted from the comparator/limiter into a reference voltage state for application to the power amplifier as a reference voltage thereof.

BRIEF DESCRIPTION OF THE DRAWINGS

The foregoing and other objects, features and advantages of the present invention will become more apparent from the following detailed description when taken in conjunction with the accompanying drawings in which.

DETAILED DESCRIPTION OF THE PREFERRED EMBODIMENT

Figure 1:
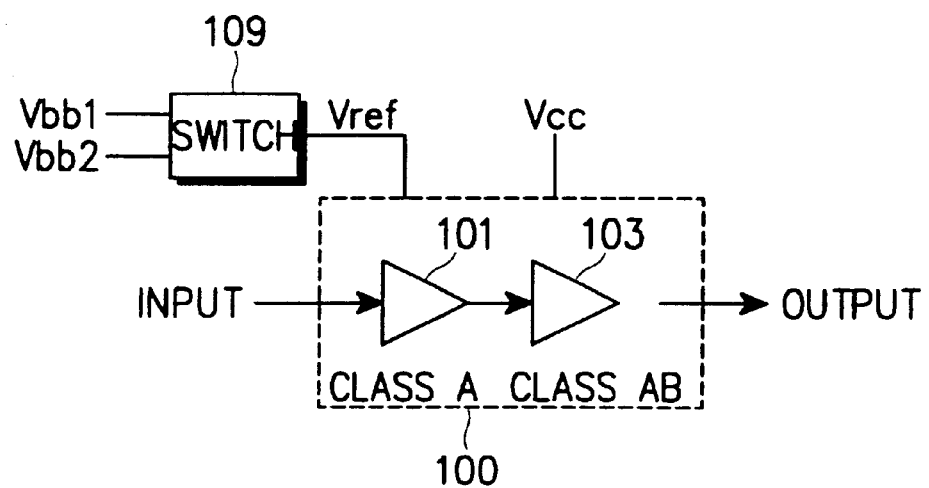
FIG. 1 lock diagram illustrating a device for controlling voltage in a power amplifier of a portable wireless terminal according to the prior art.
Figure 2:
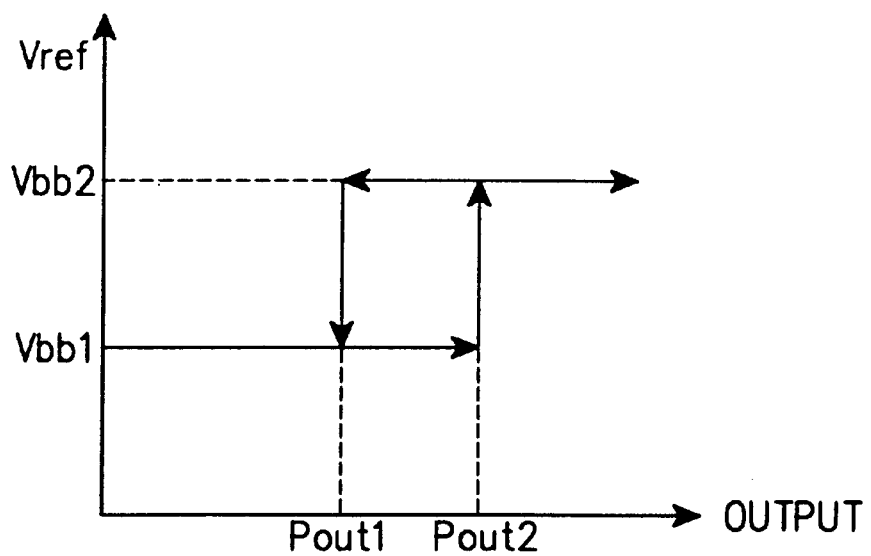
FIG. 2 is a illustrating a power supplying state according to the operation of a device for selectively controlling voltage in the power amplifier according to the prior art.

Reference will now be made in greater detail to the preferred embodiments of the present invention. In the drawings, the same or similar elements are denoted by the same reference numerals even though they are depicted in different drawings. In the following description of the present invention, numerous specific details, such as specific circuit elements, are set forth to provide a more thorough understanding of the present invention. It will be apparent, however, to those skilled in the art that many variations may be made to the present while staying within the scope and spirit of the present invention, without specifically practicing the previously mentioned specific details. The detailed description of known functions and configurations incorporated herein will be omitted to avoid obscuring the subject matter of the present invention.

Figure 3:
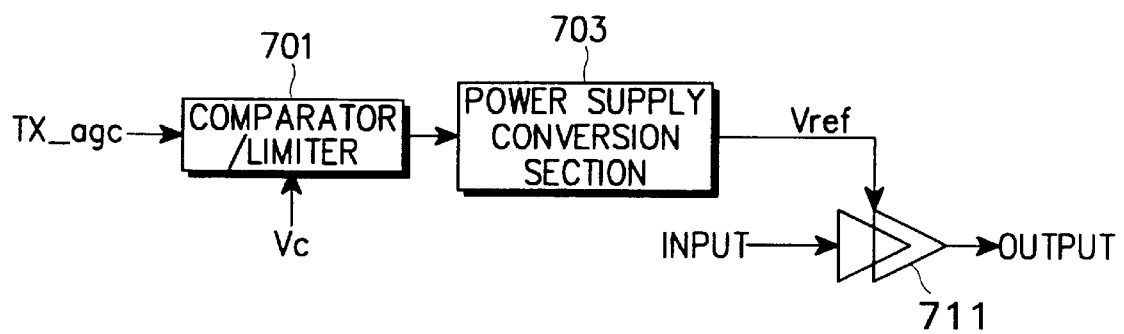
FIG. 3 is a block diagram illustrating a device for controlling voltage in a power amplifier of a portable wireless terminal according to an embodiment of the present invention.

FIG. 3 is a block diagram illustrating a device for controlling voltage in a power amplifier of a portable wireless terminal according to an embodiment of the present invention.

Referring to FIG. 3, a voltage-controlling device in the power amplifier of the present invention is shown, including a comparator/limiter 701, a power supply conversion section 703, and a power amplifier 711.

TX_AGC and Vc are applied to the comparator/limiter 701, which compares values of the two power supply voltages and applies the compared result to the power supply conversion section 703. The power supply conversion section converts the applied result into a reference voltage Vref. At this point, the converted reference voltage Vref is applied to a reference voltage Vref inputting terminal of the power amplifier 711. The applied reference voltage Vref allows an inputted signal 713 to be amplified through the power amplifier 711 to thereby output an amplified signal.

Figure 4:
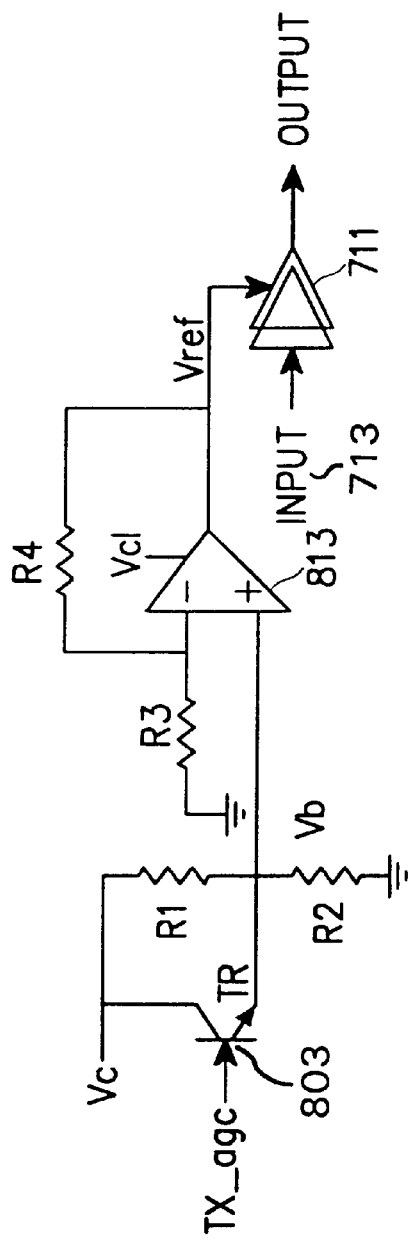
FIG. 4 is a circuit diagram illustrating the device of FIG. 3 for controlling voltage in a power amplifier of a portable wireless terminal according to a preferred embodiment of the present invention.
Figure 5:
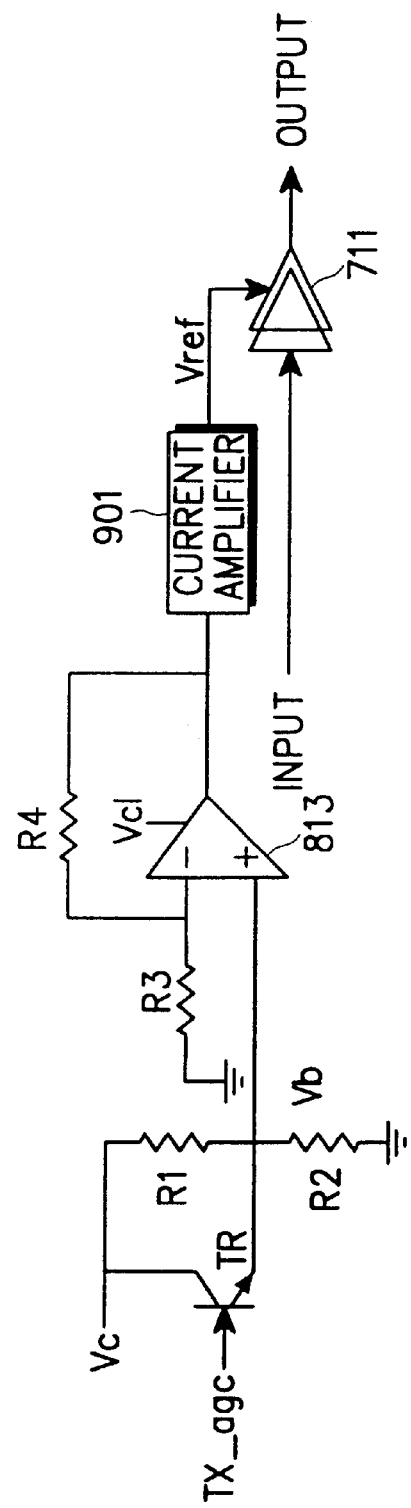
FIG. 5 is a circuit diagram illustrating the device of FIG. 3 for controlling voltage in a power amplifier of a portable wireless terminal according to another preferred embodiment of the present invention.

FIG. 4 is a circuit diagram illustrating the device of FIG. 3 for controlling voltage in a power amplifier of a portable wireless terminal according to a preferred embodiment of the present invention, and FIG. 5 is a circuit diagram illustrating the device of FIG. 3 for controlling voltage in a power amplifier of a portable wireless terminal according to another preferred embodiment of the present invention.

Now, the operation of the voltage-controlling device in the power amplifier according to FIG. 3 will be described in detail hereinafter with reference to FIGS. 4 and 5.

First, referring to FIG. 4, the power supply voltage TX_AGC is supplied to a base terminal of a transistor 803, and a power supply voltage Vc is supplied to a collector terminal thereof. An output of an emitter terminal thereof is coupled between a first resistor R1 connected to the power supply voltage Vc and a grounded second resistor R2. Also, the output of the emitter terminal of the transistor 803 is coupled to a positive terminal (+) of a driving operational amplifier (OP-AMP) 813. A grounded third resistor R3 is coupled to a negative terminal (−) of the OP-AMP 813. A fourth resistor R4 is interposed between the negative terminal (−) of the OP-AMP 813 and an output terminal thereof. The output terminal of the OP-AMP 813 supplies a reference voltage Vref to the power amplifier 711 which amplifies an input signal 713 according to the supplied reference voltage Vref.

Referring to FIG. 5, a current amplifier 901 is connected to the output terminal of the OP-AMP 813 so that when the OP-AMP 813 cannot supply sufficient current needed to establish the reference voltage Vref for the power amplifier 711, the current amplifier 901 supplies the current needed to establish the reference voltage Vref.

Figure 6:
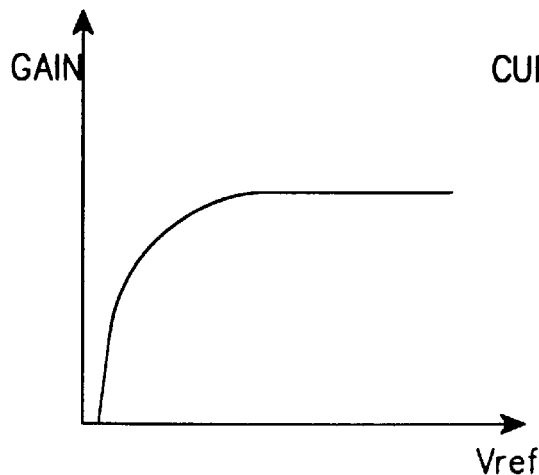
FIG. 6 is a graph illustrating a gain variation characteristic as a voltage applied to a reference Vref terminal of a typical power amplifier is varied.

FIG. 6 is a graph illustrating a gain variation characteristic as the voltage applied to a reference voltage Vref terminal (i.e. indicating mainly a base bias or an initial stage amplifying bias of a transistor) of a typical power amplifier is varied.

Referring to FIG. 6, if a value of the reference voltage Vref is greater than a predetermined level, a gain is constant, but if the value of the reference voltage Vref is less than the predetermined level, the gain is reduced sharply. At this point, the relation of the reference voltage Vref to the current is shown in FIG. 7.

Figure 7:
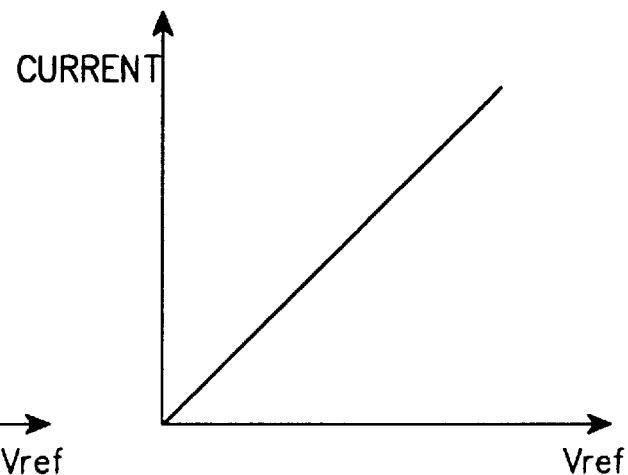
FIG. 7 is a graph illustrating a current variation characteristic corresponding to the gain variation shown in FIG. 6.

FIG. 7 is a graph illustrating a current variation characteristic corresponding to the gain variation shown in FIG. 6.

Figure 8:
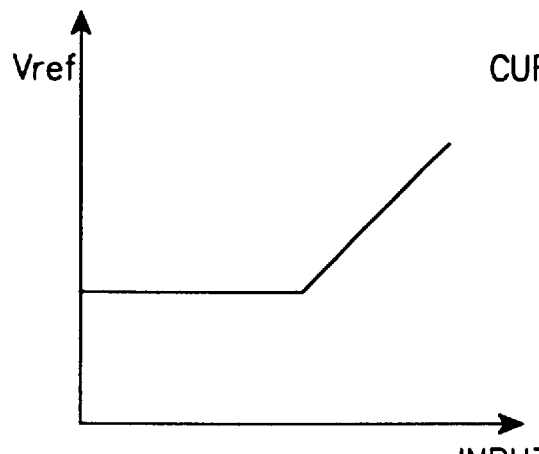
FIG. 8 is a graph illustrating a voltage variation characteristic of the reference voltage terminal as an input is varied according to a preferred embodiment of the present invention.

Referring to FIG. 7, in the case where the output of the power amplifier 711 is low, if the reference voltage Vref is set at a high level, additional unnecessary current is consumed. However, if the reference voltage Vref is set at a very low level, the gain of the power amplifier 711 is reduced sharply, making it difficult to control the gain. Therefore, with reference to FIG. 8, if a value of the power supply voltage inputted to the power amplifier 711 is less than a predetermined level, the reference voltage Vref of the power amplifier 711 is maintained at a constant level so that the reference voltage Vref is prevented from becoming very low and decreasing the gain, but if the value of the power supply voltage inputted to the power amplifier 711 is greater than the predetermined level, the reference voltage Vref of the power amplifier 711 is increased in proportion to the inputted power supply voltage so that unnecessary current consumption in the power amplifier 711 is minimized. Accordingly, efficiency in the operation of the power amplifier 711 is increased, which extends serviceable time of the wireless terminal using a battery.

Figure 9:
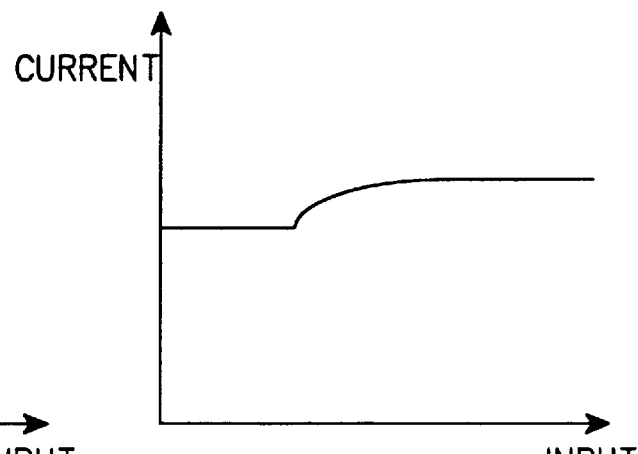
FIG. 9 is a graph illustrating a current variation characteristic of the reference voltage terminal as the input is varied.

FIG. 9 illustrates graphically a variation characteristic of the reference voltage terminal of the power amplifier as the current is varied.

The operation of the device for controlling voltage in the power amplifier of the portable wireless terminal according to the present invention will be described hereinafter with reference to FIGS. 3 to 5, and FIGS. 8 and 9.

First, referring to FIG. 3, the value of the transmitting automatic gain controlled supply voltage TX_AGC 707 and the value of the operating supply voltage Vc are inputted to the comparator/limiter 701 which compares TX_AGC with Vc. When TX_AGC is smaller than Vc, the comparator/limiter 701 outputs a constant voltage to the power supply conversion section 703 which converts the outputted voltage into a corresponding reference voltage Vref for the power amplifier 711. On the other hand, when TX_AGC is greater than Vc, the comparator/limiter 701 outputs a voltage in proportion to an increase in the value of the transmitting automatic gain controlled supply voltage TX_AGC to the power supply conversion section 703 which converts the outputted voltage into a corresponding reference voltage Vref for the power amplifier 711.

One preferred exemplary embodiment for implementing such a power supply conversion process will be described in detail hereinafter with reference to FIG. 4.

Referring to FIG. 4, when the value of the transmitting automatic gain controlled supply voltage (TX_AGC) is smaller than Vb+0.7V, the output of the OP-AMP 813 is constant, but when the value of the transmitting automatic gain controlled supply voltage (TX_AGC) is greater than Vb+0.7V, a power supply voltage Vb is increased according to an increase of the TX_AGC so that an output of the driving amplifier OP-AMP 813 is also increased. Accordingly, the result of such an operation is shown graphically in FIG. 8. Then, the power supply of the driving amplifier OP-AMP 813 can supply a supply voltage Vc1 in order to supply a maximum of the reference voltage Vref to be applied to the power amplifier 711. At this time, the supply voltage Vc1 may be equal to or different from the supply voltage Vc. The input scaled in an abscissa of the graph shown in FIG. 8 corresponds to the transmitting automatic gain controlled supply voltage (TX_AGC) because a gain of an AGC amplifier is increased (not shown) according to the transmitting automatic gain controlled supply voltage (TX_AGC) so that an input of the power amplifier 711 is increased. The voltage controlling device in the power amplifier of a portable wireless terminal as shown in FIG. 5 is similar to that of FIG. 4, with the addition of a separate current amplifier 901 for sufficiently supplying a current to the power amplifier 711 in the case where the driving amplifier OP-AMP 813 is not able to supply a current sufficient to replenish the consumed current of the reference voltage Vref applied to the power amplifier 711. The overall operation of the voltage controlling device shown in FIG. 5 is similar to that of the voltage controlling device shown in FIG. 4 with the added amplifying operation of the current amplifier 901.

As can be seen from the foregoing, the voltage controlling device in a power amplifier of the present invention enables effective control of consumed current in the power amplifier according to an output of a portable wireless communication terminal using a battery, thereby minimizing unnecessary current consumption in the power amplifier to maximize the period of time during which the battery may be used.

While this invention has been described in connection with what is presently considered the most practical and preferred embodiment, it is to be understood that the invention is not limited to the disclosed embodiment, but is intended to cover various modifications within the spirit and scope of the present invention as defined by the appended claims.

What is claimed is:

1. A device for controlling voltage in at least one power amplifier of a portable wireless terminal, comprising:
   a comparator/limiter for comparing a value of a transmitting automatic gain controlled supply voltage (TX_AGC) and a value of an operating supply voltage, and outputting a compared result, wherein the compared result is a constant result value when the value of TX_ACG is smaller than the value of the operating supply voltage; and
   a power supply conversion section for applying a state of the compared result to a reference voltage value at the at least one power amplifier for amplifying signals input based on the reference voltage value.

2. The device as claimed in claim 1, further comprising a current amplifier amplifying a current of the reference voltage outputted from the power supply conversion section for application to the power amplifier as a reference voltage thereof.

3. The device as claimed in claim 1, wherein the comparator/limiter comprises:
   a transistor having a base terminal and a collector terminal, the gain controlled supply voltage (TX_AGC) being supplied to the base terminal of the transistor and the operating supply voltage being supplied to the collector terminal;
   a first resistor having one terminal thereof supplied with an output generated from an emitter terminal of the transistor and another terminal thereof supplied with the operating supply voltage; and
   a second resistor having one terminal thereof supplied with the output generated from the emitter terminal of the transistor and another terminal thereof grounded.

4. The device as claimed in claim 1, wherein the power supply conversion section comprises:
   a driving amplifier (OP-AMP) having a positive terminal and a negative terminal, the positive terminal being supplied with the compared result outputted from the comparator/limiter and the negative terminal being coupled to ground through a resistor;
   a feedback resistor having one terminal thereof coupled to the negative terminal of the OP-AMP and the other terminal coupled to an output terminal of the OP-AMP; and a third resistor interposed between the negative terminal of the OP-AMP and ground.

5. The device as claimed in claim 1, wherein the comparator/limiter outputs a result according to an output of a reference voltage in proportion to an increase in the transmitting automatic gain controlled supply voltage when the value of the transmitting automatic gain controlled supply voltage (TX_AGC) is greater than the value of the operating supply voltage.

6. A device for controlling voltage in a power amplifier of a portable wireless terminal, comprising:

a power amplifier for adjusting an amplification degree of a signal inputted according to the supply state of a reference voltage to output the adjusted signal;

a comparator/limiter for comparing a value of a transmitting automatic gain controlled supply voltage (TX_AGC) and a value of an operating supply voltage to output the compared result, the comparator/limiter comprising:

a transistor having a base terminal and a collector terminal, the gain controlled supply voltage (TX_AGC) being supplied to the base terminal of the transistor and the operating supply voltage being supplied to the collector terminal;

a first resistor having one terminal thereof supplied with an output generated from an emitter terminal of the transistor and another terminal thereof supplied with the operating supply voltage; and a second resistor having one terminal thereof supplied with the output generated from the emitter terminal of the transistor and another terminal thereof grounded;

a power supply conversion section for converting a state of the compared result outputted from the comparator/limiter into a reference voltage state for application to the power amplifier as a reference voltage thereof, the power supply conversion section comprising:

a driving amplifier (OP-AMP) having a positive terminal and a negative terminal, the positive terminal being supplied with the compared result outputted from the comparator/limiter and the negative terminal being coupled to ground through a resistor;

a feedback resistor having one terminal thereof coupled to the negative terminal of the OP-AMP and the other terminal coupled to an output terminal of the OP-AMP; and a third resistor interposed between the negative terminal of the OP-AMP and ground; and a current amplifier for amplifying a current of the reference voltage outputted from the power supply conversion section for application to the power amplifier as a reference voltage thereof.

7. The device as claimed in claim 6, wherein:

the comparator/limiter outputs a result according to an output of a constant reference voltage when the value of the transmitting automatic gain controlled supply voltage (TX_AGC) is smaller than the value of the operating supply voltage; and the comparator/limiter outputs the result according to an output of a reference voltage in proportion to an increase in the transmitting automatic gain controlled supply voltage when the value of the transmitting automatic gain controlled supply voltage (TX_AGC) is greater than the value of the operating supply voltage.

* * * * *